United States Patent
Mercado Velazquillo et al.

(10) Patent No.: US 11,161,455 B2
(45) Date of Patent: Nov. 2, 2021

(54) DEFROST/DEFOG SYSTEM SIDE MIRROR WITH PELTIER ELEMENT

(71) Applicant: Ford Global Technologies, LLC, Dearborn, MI (US)

(72) Inventors: David Mercado Velazquillo, Mexico City (MX); Alfonso Hickman Guevara, Tlalnepantla (MX); Luis Jesus Chavela Guerra, Mexico City (MX); Luis Olmos Gonzalez, Tlalnepantla (MX); Raul Ezequiel Alvarez Ruiz, Mexico City (MX)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 405 days.

(21) Appl. No.: 15/827,288

(22) Filed: Nov. 30, 2017

(65) Prior Publication Data
US 2019/0161013 A1 May 30, 2019

(51) Int. Cl.
*B60R 1/06* (2006.01)
*H01L 35/28* (2006.01)

(52) U.S. Cl.
CPC ............ *B60R 1/0602* (2013.01); *H01L 35/28* (2013.01)

(58) Field of Classification Search
CPC .............................. B60R 1/0602; H01L 35/28
USPC ........................................... 359/512; 219/219
See application file for complete search history.

(56) References Cited

U.S. PATENT DOCUMENTS

| | | | | |
|---|---|---|---|---|
| 2,693,589 A | * | 11/1954 | Hopkins | B60R 1/0602 362/547 |
| 3,686,473 A | * | 8/1972 | Shirn | B60R 1/0602 219/219 |
| 3,732,702 A | * | 5/1973 | Desch | A47B 67/005 219/219 |
| 4,071,736 A | * | 1/1978 | Kamerling | B60R 1/0602 219/219 |
| 4,631,391 A | * | 12/1986 | Tiepke | B60R 1/0602 219/219 |
| 5,079,406 A | * | 1/1992 | Nagy | B60R 1/0602 219/219 |
| 5,155,625 A | * | 10/1992 | Komatsu | B60R 1/0602 219/219 |
| 5,440,425 A | | 8/1995 | Kadooka et al. | |
| 5,594,585 A | * | 1/1997 | Komatsu | B60R 1/06 219/202 |
| 6,290,361 B1 | * | 9/2001 | Berzin | B60R 1/0602 15/250.003 |
| 7,342,707 B2 | | 3/2008 | Roberts et al. | |
| 8,670,035 B2 | | 3/2014 | Robert | |

(Continued)

FOREIGN PATENT DOCUMENTS

| | | | |
|---|---|---|---|
| CN | 201114841 | * | 9/2008 |
| CN | 205872001 U | | 1/2017 |

(Continued)

*Primary Examiner* — Ricky D Shafer
(74) *Attorney, Agent, or Firm* — David Coppiellie; Carlson, Gaskey & Olds, P.C.

(57) ABSTRACT

A side mirror includes a housing, a mirror moveably attached with the housing, and a Peltier element mounted in the housing adjacent the mirror. There may also be a controller that is electrically connected with the Peltier element. The controller is configured to apply an electric current to the Peltier element in an electric current direction that depends on temperature and humidity data.

9 Claims, 4 Drawing Sheets

(56) References Cited

U.S. PATENT DOCUMENTS

| | | | | |
|---|---|---|---|---|
| 2005/0000559 A1* | 1/2005 | Horio | ..................... | H01L 35/30 |
| | | | | 136/205 |
| 2008/0121034 A1* | 5/2008 | Lynam | ............... | B60H 1/00792 |
| | | | | 73/335.05 |
| 2008/0257050 A1* | 10/2008 | Watanabe | ............... | G01S 7/521 |
| | | | | 73/627 |
| 2010/0163220 A1* | 7/2010 | Nakajima | .......... | B60H 1/00785 |
| | | | | 165/202 |
| 2010/0199686 A1 | 8/2010 | Taras et al. | | |

FOREIGN PATENT DOCUMENTS

| | | | |
|---|---|---|---|
| CN | 106476699 | | 3/2017 |
| CN | 206589791 | * | 10/2017 |

\* cited by examiner

DEFROST/DEFOG SYSTEM SIDE MIRROR WITH PELTIER ELEMENT

BACKGROUND

Exterior side mirrors for vehicles are subject to the climatic conditions of the surrounding environment. In cold conditions, the mirror may collect frost or snow. In warm and humid conditions, the mirror may collect moisture as fog. Systems for defrosting or defogging often include a resistance-heating wires. Such systems can take time to heat up, thereby also lengthening the time for defrosting or defogging.

SUMMARY

A side mirror according to an example of the present disclosure includes a housing, a mirror moveably attached with the housing, and a Peltier element mounted in the housing adjacent the mirror.

In further examples, there can also be a controller that is electrically connected with the Peltier element. The controller is configured to apply an electric current to the Peltier element in an electric current direction that depends on temperature and humidity data.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Figure 1:
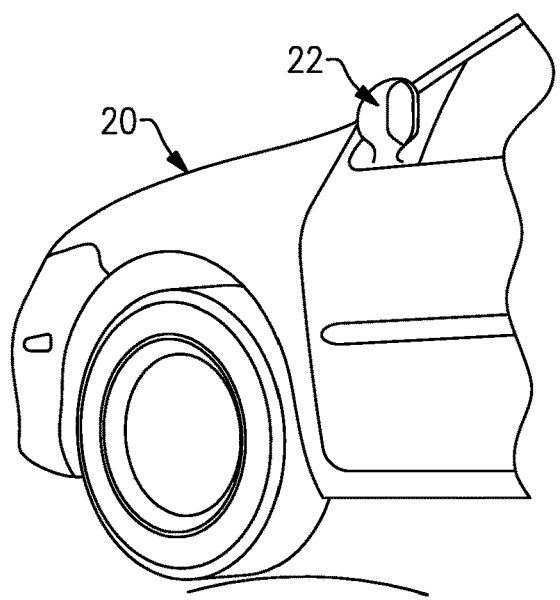
FIG. 1 illustrates a vehicle with a side mirror.

FIG. 1 illustrates a vehicle 20 that has a side mirror 22. As will be described herein, the side mirror includes an internal heating system that facilitates rapid defrosting and defogging of the side mirror 22.

Figure 2:
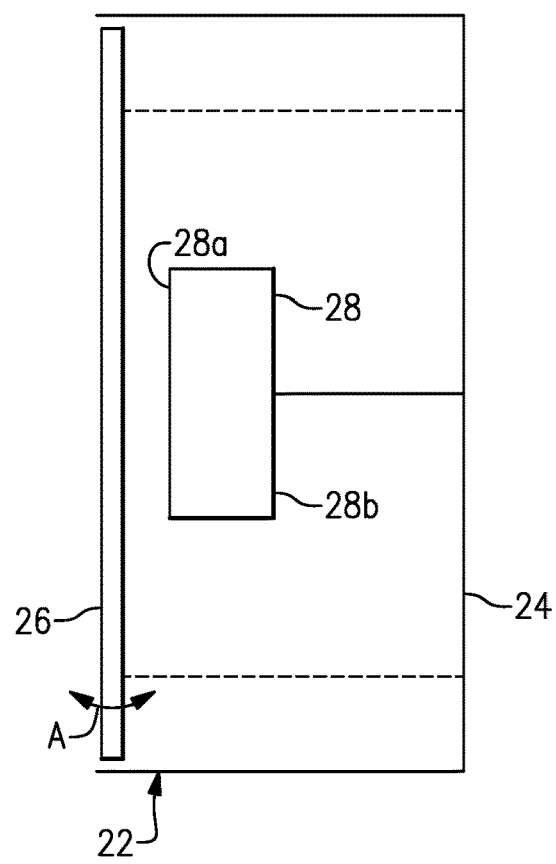
FIG. 2 illustrates an example of a side mirror.

FIG. 2 schematically depicts an example of the side mirror 22. The side mirror 22 includes a housing 24, a mirror 26 that is moveably attached (as represented at arrow A) with the housing 24, and a Peltier element 28 mounted in the housing 24 adjacent the mirror 26. The Peltier element 28 has a first side 28a that faces toward the mirror 26 and a second side 28b that faces away from the mirror 26, into the interior of the housing 24.

The Peltier element 28 is a device that operates based on the Peltier effect. Applied electric current induces a temperature difference between the sides 28a and 28b. Current applied in a first electric current direction causes heating of the first side 28a and cooling of the second side 28b. Current in a second, opposite direction causes cooling of the first side 28a and heating of the second side 28b. The construction of Peltier elements is generally known and is thus not described further herein.

Figure 3A:
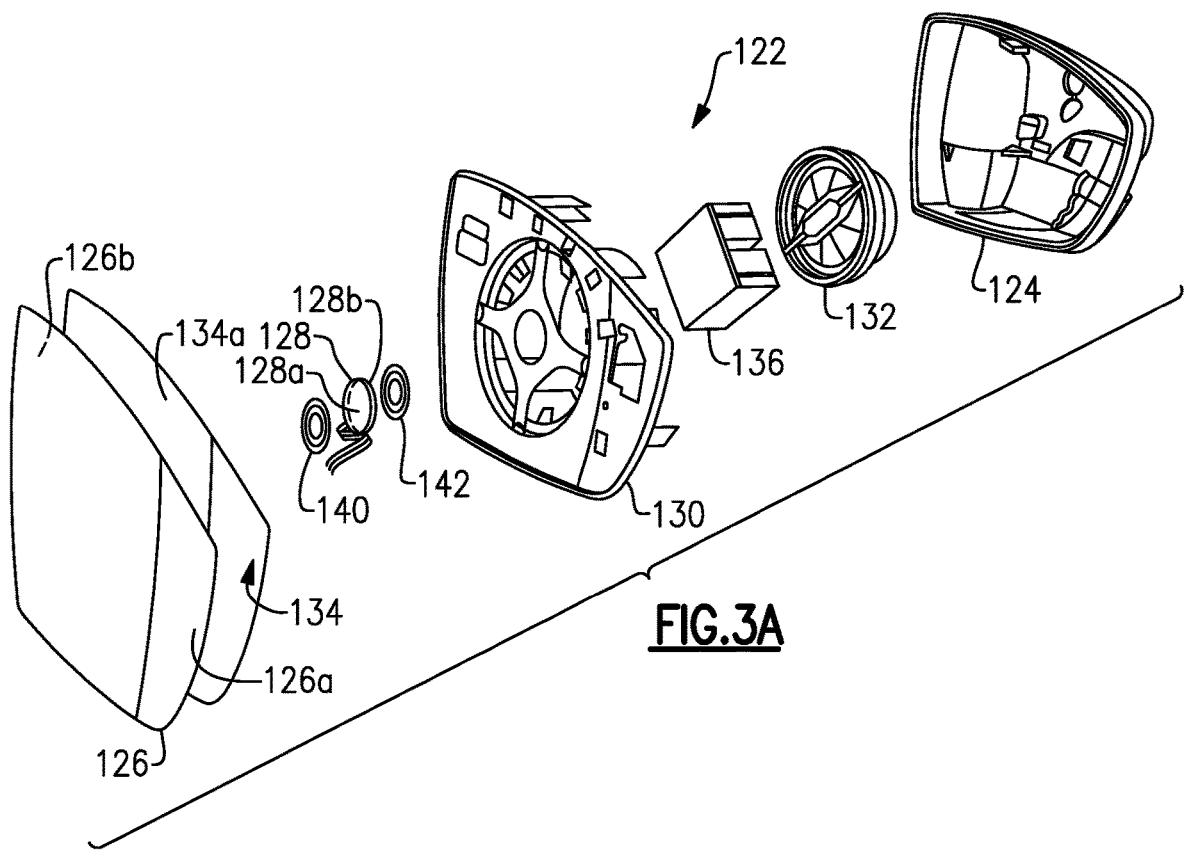
FIG. 3A illustrates an expanded view of another example side mirror.
Figure 3B:
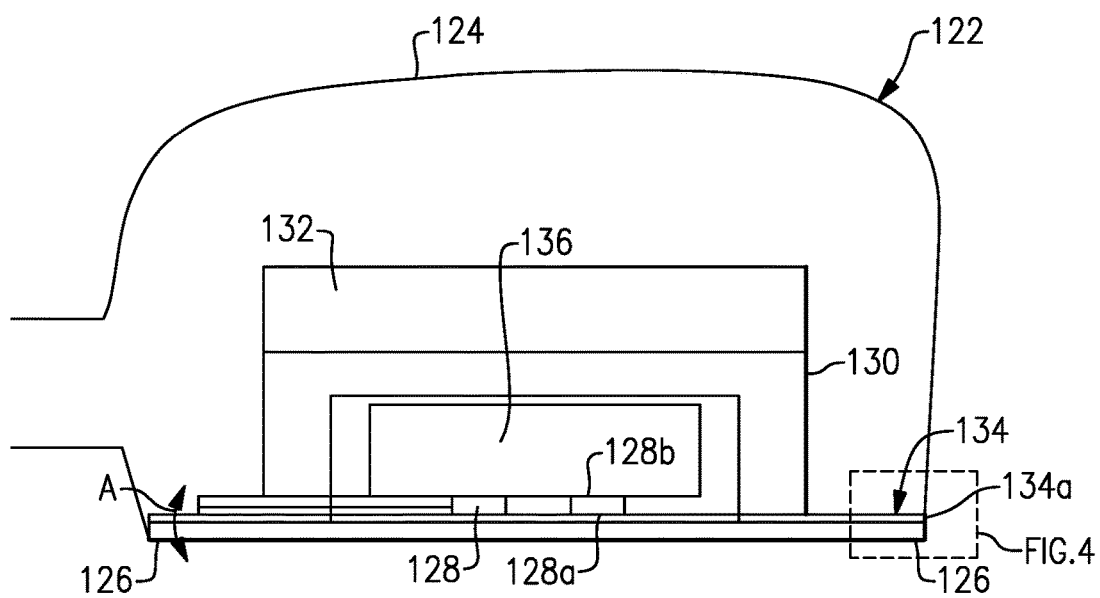
FIG. 3B illustrates a "top-down" view of the side mirror of FIG. 3A.

FIG. 3A illustrates an expanded view of various components of another example side mirror 122, and FIG. 3B illustrates a schematic "top-down" view through the side mirror 122. In this example, the side mirror 122 includes a housing 124, a mirror 126 that is moveably attached (as represented at arrow A) with the housing 124, and a Peltier element 128 mounted in the housing 124 adjacent the mirror 126. The Peltier element 128 has a first side 128a that faces toward the mirror 126 and a second side 128b that faces away from the mirror 126. The mirror 126 has an exterior side 126a and an interior side 126b that faces toward the Peltier element 128.

In this example, the Peltier element 128 is held/mounted in an interior housing piece 130. For example, the Peltier element 128 can be press fit into the interior housing pieces and/or secured with adhesive or mechanical retainer or fastener. The interior housing piece 130 and the housing 124 may be, but are not limited to, molded plastic pieces. The interior housing piece 130 may be secured to the housing 124, such as by a mechanical fastener or retainer or mechanical snap-fit. The interior housing piece 130 also secures an actuator 132, which is operable to move the mirror 126 relative to the housing 124.

Figure 4:
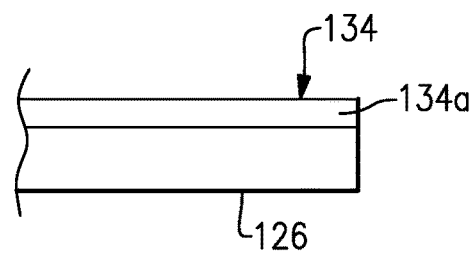
FIG. 4 illustrates a representative portion of a side mirror showing a heat distribution layer in contact with a mirror.

The side mirror 122 additionally includes several features that facilitate thermal control. The side mirror includes a heat distributer 134 and a heat sink 136. The heat distributer 134 facilitates uniform and rapid thermal transfer between the mirror 126 and the Peltier element 128. The heat distributer 134 is located between the Peltier element 128 and the mirror 126 and is in contact with the mirror 126, as also shown in FIG. 4. In the example shown, the heat distributer 134 is a continuous metal layer 134a. The metal or alloy of the metal layer 134a provides good thermal conductivity. As an example, the metal layer 134a is aluminum-based and can thus be pure aluminum, substantially pure aluminum, or an aluminum alloy that is predominantly aluminum.

The metal layer 134a covers, and is in contact with, a large portion of the second side 128b of the mirror 126. For instance, the metal layer 134a is in contact with an area of the second side 128b that is larger than the area of the first side 128a of the Peltier element 128 that faces toward the mirror 126. The metal layer 134a thus serves to enlarge the thermal footprint of the Peltier element 128. In one further example, the metal layer 134a is in contact with more than 50% of the interior side 126b of the mirror 126, but more preferably is in contact with more than 90% of interior side 126b.

The heat sink 136 serves to help remove heat from the Peltier element 128. For example, the heat sink 136 is attached to the Peltier element 128, such as by mechanical attachment or adhesive. Although not limited, the heat sink 136 in the illustrated example is a plate and fin heat sink. The fins provide surface area for exposure to airflow through the side mirror 122 to remove heat.

Figure 5:
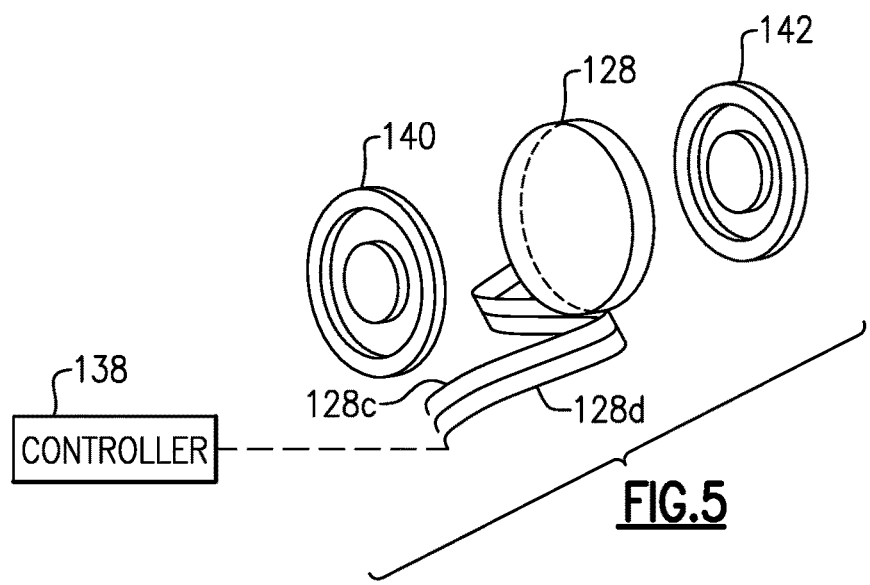
FIG. 5 illustrates a Peltier element and several sensors.

Referring also to FIG. 5, the Peltier element 128 includes electrical leads 128c and 128d that are electrically connected with a controller 138. Most typically, the controller 138 will be remotely located, such as in the vehicle 20. The controller 138 may include hardware, such as a microprocessor and memory, software, or combinations thereof.

Figure 6:
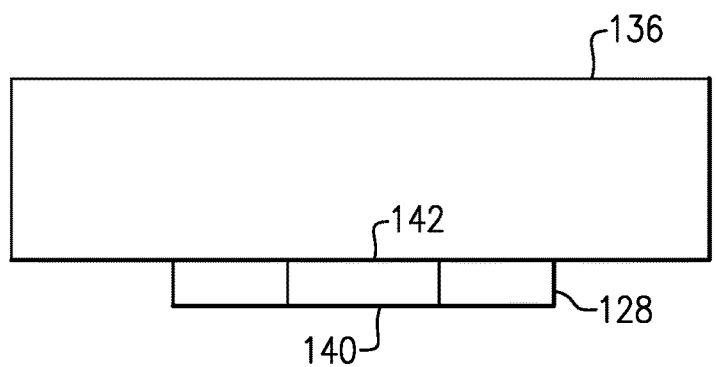
FIG. 6 illustrates a heat sink attached with a Peltier element.

Referring also to FIG. 6, the side mirror 122 further includes a temperature sensor 140 and a humidity sensor 142 mounted in the housing 124. In this example, the sensors 140/142 are located adjacent the Peltier element 128. The sensors 140/142 are also electrically connected with the controller 138, to send temperature and humidity data to the controller 138.

The defrost and defog operations of the side mirror 122 can be automated. For example, the controller 138 is configured to apply an electric current to the Peltier element in an electric current direction that depends on the temperature and humidity data from the sensors 140/142. That is, if conditions indicative of frost or snow are present, the controller 138 selects to apply current in a first electric current direction to cause heating of the first side 128a of the Peltier element 128. The heat distributer 134 rapidly conducts the heat to spread heat across the surface of the mirror 126 to melt the frost/snow. If conditions indicative of fog are present, the controller 138 selects to apply current in either the first or second electric current direction to cause heating or cooling of the first side 128a of the Peltier element 128. The heat distributer 134 rapidly conducts the heat or cold across the surface of the mirror 126 to melt the fog.

The conditions that are indicative of frost or snow or fog may be in a data lookup table in a memory in the controller 138. The controller 138 may periodically check instant values of temperature and humidity data from the sensors 140/142 against the lookup table to thereby determine whether to 1) remain deactivated (no current), 2) activate to apply current in the first current direction, 3) activate to apply current in the second direction, or 4) deactivate to stop application of current from 2) or 3).

Figure 7:
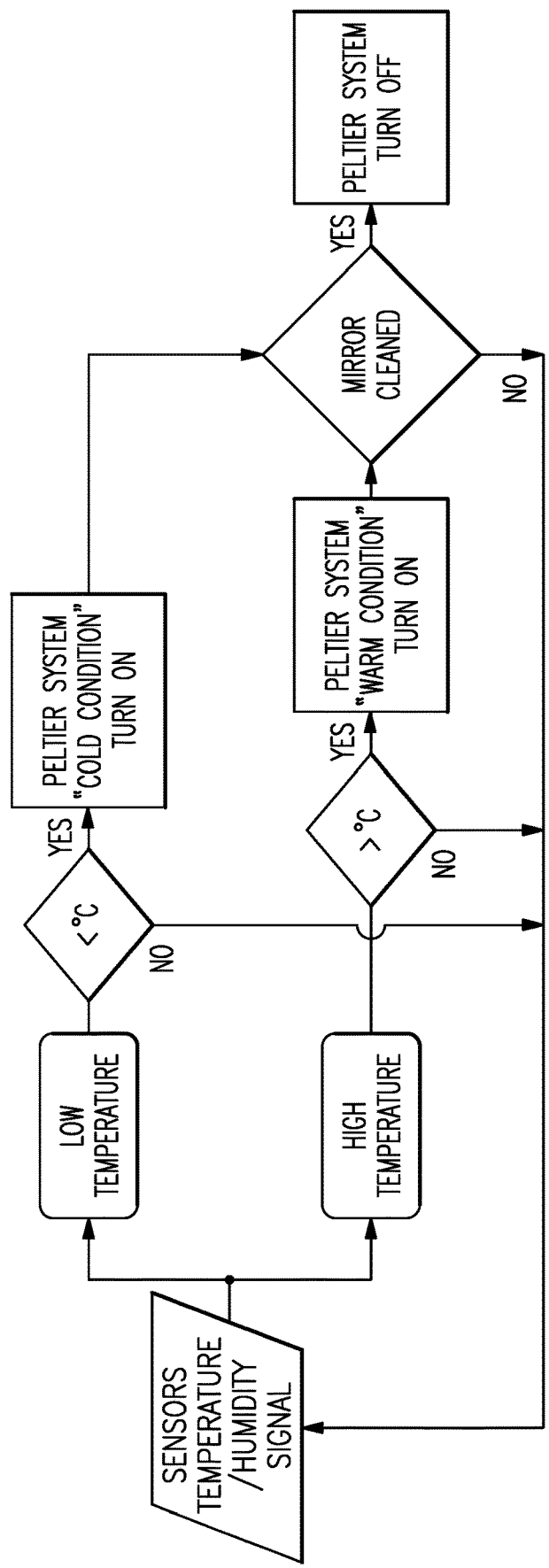
FIG. 7 illustrates a decision algorithm for a controller to control operation of a side mirror with a Peltier element.

FIG. 7 illustrates a further example of a decision algorithm that can be programmed into the controller 138. In this example, the controller 138 looks at the instant temperature in comparison to a predetermined temperature or temperature range. If the predetermined temperature or range is lower than the instant temperature, the controller 138 applies current in the second electric current direction to cause cooling of the first side 128a of the Peltier element 128 and thus cooling of the mirror 126. If the predetermined temperature or range is higher than the instant temperature, the controller 138 applies current in the first electric current direction to cause heating of the first side 128a of the Peltier element 128 and thus heating of the mirror 126. The controller 138 can follow a similar decision algorithm for humidity. In any of the above examples, the controller may verify whether the mirror 126 is cleared of frost or fog, such as by checking that the instant temperature and/or humidity is within a predetermined range.

Rather than be automated, the operation of the Peltier element 128 may be manual. For manual operation, the sensors 140/142 may be excluded from the system. In manual operation, a user may activate or deactivate the Peltier cell 128 when the user perceives a need to defrost or defog the side mirror 122. The controller 138 may still be used, but with less capability. For instance, the controller 138 may be programmed to deactivate the Peltier element 128 after a predetermined time period of activation or once a predetermined temperature threshold is met. This also serves to protect the Peltier element from damage due to extended operation or overheating.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from this disclosure. The scope of legal protection given to this disclosure can only be determined by studying the following claims.

What is claimed is:

1. A side mirror comprising:
   a housing;
   a mirror moveably attached with the housing;
   a Peltier element mounted in the housing adjacent the mirror;
   a temperature sensor and a humidity sensor mounted in the housing and operable to generate temperature and humidity data, respectively; and
   a controller electrically connected with the Peltier element, the controller including a lookup table and being operable to compare instant values of the temperature and humidity data against the lookup table, the controller configured to apply an electric current to the Peltier element in an electric current direction that depends on temperature and humidity data, wherein based on comparison of the instant values of the temperature and humidity data against the lookup table the controller is configured to i) if there is no current to the Peltier element, continue to apply no current, ii) apply current in the first current direction to the Peltier element, iii) apply current in the second direction to the Peltier element, or iv) stop application of current to the Peltier element.

2. The side mirror as recited in claim 1, wherein the Peltier element includes a first side that faces the mirror and a second, opposite side that faces away from the mirror, and the controller is configured to apply the electric current to the Peltier element in either a first direction or a second direction responsive to predetermined conditions of the temperature and humidity data to cause heat to be emitted from either the first side or the second side to cause the mirror to be heated or cooled, respectively.

3. The side mirror as recited in claim 2, further comprising a heat sink attached to the second side of the Peltier element.

4. The side mirror as recited in claim 2, further comprising a heat distributer located between the Peltier element and the mirror, and the heat distributer is in contact with the mirror.

5. The side mirror as recited in claim 4, wherein the heat distributer is a continuous metal layer.

6. The side mirror as recited in claim 5, wherein the continuous metal layer is aluminum-based.

7. The side mirror as recited in claim 5, wherein the continuous metal layer covers more than 90% of an inside surface of the mirror that faces into the housing.

8. The side mirror as recited in claim 1, wherein the Peltier element includes electrical leads for electrically connecting the Peltier element.

9. The side mirror as recited in claim 1, further comprising a plate and fin heat sink attached to the second side of the Peltier element.

* * * * *